US008870423B2

(12) United States Patent
Mihara et al.

(10) Patent No.: US 8,870,423 B2
(45) Date of Patent: Oct. 28, 2014

(54) VEHICLE DECORATIVE LIGHTING DEVICE AND VEHICLE LAMP

(75) Inventors: Teruhiko Mihara, Tokyo (JP); Yasuaki Kaizumi, Tokyo (JP); Kazuya Shiraishi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 239 days.

(21) Appl. No.: 13/471,678

(22) Filed: May 15, 2012

(65) Prior Publication Data

US 2013/0044503 A1 Feb. 21, 2013

(30) Foreign Application Priority Data

May 19, 2011 (JP) ................................ 2011-111959
May 19, 2011 (JP) ................................ 2011-111960

(51) Int. Cl.

| | |
|---|---|
| ***F21V 9/00*** | (2006.01) |
| ***F21V 7/04*** | (2006.01) |
| ***H01L 33/00*** | (2010.01) |
| ***B60Q 1/00*** | (2006.01) |
| ***B60Q 3/00*** | (2006.01) |
| ***B60Q 11/00*** | (2006.01) |
| ***B60Q 3/04*** | (2006.01) |
| ***F21S 8/10*** | (2006.01) |
| ***F21V 11/00*** | (2006.01) |
| ***F21V 21/00*** | (2006.01) |
| ***F21V 29/00*** | (2006.01) |

(52) U.S. Cl.
CPC ......... *F21S 48/2268* (2013.01); *F21S 48/1241* (2013.01); *F21S 48/215* (2013.01); *F21S 48/115* (2013.01); *F21S 48/2237* (2013.01)
USPC ........... 362/511; 362/555; 362/507; 362/543; 362/544; 362/545

(58) Field of Classification Search
CPC ...... B60Q 1/0011; B60Q 1/0047; B60Q 1/24; B60Q 1/2619; F21S 48/1241; F21S 48/2237; F21S 48/2268
USPC .................. 362/511, 555, 507, 543, 544, 545
See application file for complete search history.

(56) References Cited

U.S. PATENT DOCUMENTS 5,984,497 A 11/1999 Foerstner et al.
6,450,677 B1 * 9/2002 Knauer et al. ................ 362/551

(Continued)

FOREIGN PATENT DOCUMENTS

DE 102009010507 A1 8/2010
EP 2101202 A1 9/2009

(Continued)

OTHER PUBLICATIONS

Partial European Search Report for European Patent App. No. 12003950.8 (Aug. 29, 2012).

*Primary Examiner* — Ismael Negron
*Assistant Examiner* — William N Harris
(74) *Attorney, Agent, or Firm* — Kenealy Vaidya LLP

(57) ABSTRACT

A vehicle decorative lighting device and a vehicle lamp including a lighting device can include a light guide lens formed in a substantially U-shape and a pair of LED light sources that can emit various color lights. Each of the light sources can be located at both end surfaces of the light guide lens having a U-shaped light-emitting surface. The vehicle lamp can include a lamp room between an outer lens and a housing, and can incorporate various vehicle lamps such as a headlight along with the lighting device in the lamp room. The lighting device can be located in the lamp room so as to emit various U-shaped color lights along a periphery of the outer lens. Thus, the disclosed subject matter can include providing vehicle lamps including the decorative lighting device having a harmonious favorable light distribution, for example, such that combine a headlight with a position lamp.

20 Claims, 13 Drawing Sheets

(56) References Cited

U.S. PATENT DOCUMENTS

| | | | | |
|---|---|---|---|---|
| 6,641,295 | B1 | 11/2003 | Hu | |
| 7,976,203 | B2 | 7/2011 | Okada | |
| 2005/0276565 | A1 | 12/2005 | Bourdin et al. | |
| 2006/0067084 | A1 * | 3/2006 | Stefanov | 362/511 |
| 2009/0207629 | A1 | 8/2009 | Fujiyama et al. | |
| 2010/0073954 | A1 | 3/2010 | Gebauer | |
| 2010/0254152 | A1 * | 10/2010 | Taleb-Bendiab et al. | 362/551 |

FOREIGN PATENT DOCUMENTS

| | | | |
|---|---|---|---|
| JP | 2000-123610 | A | 4/2000 |
| JP | 3181145 | B2 | 7/2001 |
| JP | 2009-193892 | A | 8/2009 |
| JP | 2010-97909 | A | 4/2010 |

* cited by examiner

VEHICLE DECORATIVE LIGHTING DEVICE AND VEHICLE LAMP

This application claims the priority benefit under 35 U.S.C. §119 of Japanese Patent Application No. 2011-111959 filed on May 19, 2011 and Japanese Patent Application No. 2011-111960 filed on May 19, 2011, both of which are hereby incorporated in their entireties by reference.

BACKGROUND

1. Field

The presently disclosed subject matter relates to vehicle lighting devices and vehicle lamps including decorative lighting devices and lamps, and more particularly to vehicle decorative lighting devices having a high visibility and a favorable light distribution, which can be incorporated along an outer periphery of a vehicle lamp. Thus a vehicle lamp that includes the decorative lighting device or devices can have a high visual quality which can emit harmonious light with respect to other lighting devices or lamps. The decorative lighting lamps can be used as a position lamp when the vehicle lamps are used as a headlight.

2. Description of the Related Art

Various vehicle lamps, including decorative lighting devices that form secondary light distributions, are known as a vehicle lamp, including headlights. For example, a conventional illumination device for vehicles, which can be incorporated into a headlight, is disclosed in Patent Document No. 1 (U.S. Pat. No. 5,984,497).

FIG. 12*a* is a schematic top view showing a conventional headlight including an illumination device which is formed in a rectangular shape, and FIG. 12*b* is a schematic cross-sectional side view showing the conventional headlight of FIG. 12*a* in which the illumination device is not shown, and both of which are disclosed in Patent Document No. 1.

The conventional headlight includes: a housing 10 having a light outlet opening; a reflector 12 arranged in the housing 10; a first light source 14, which is formed as an incandescent lamp or a gas discharge lamp, inserted in the reflector 12; a disk 16 being a light-permeable member and covering the light outlet opening of the housing 10; and a light guide element 20 emitting light as seen in a light outlet direction 18 of the headlight and being arranged on the disk 16 or on an edge of the housing 10.

FIG. 13 is a schematic view depicting the light guide element 20, which is used for the conventional headlight shown in FIG. 12*a*. The light guide element 20 includes: a second light source 24; a reflector 26 formed in an ellipsoidal shape, in which a first focal point is located at the second light source 24 and a second focal point is located at an inlet end 22 of light guiding fibers 28 in order to concentrate light emitted from the second light source 24 at the inlet end 22; and a part of an exterior surface 30 of the light guide element 20 configured to emit the light emitted from the second light source 24.

Accordingly, the conventional headlight may form a light distribution pattern such as a low beam, a high beam and the like using light emitted from the first light source 14 and the reflector 12. The light guide element 20 incorporated into the housing 10 of the headlight may provide a secondary light distribution pattern such as a side marker lamp using the light emitted from the second light source 24 and the exterior surface 30.

However, the light guiding fibers 28 used for the light guide element 20 may be a member for transmitting light from the inlet end 22 to an outlet end in nature, and may not be suitable for emitting light from an exterior surface thereof. Therefore, it may be difficult for the light guide element 20 to maintain at a high light-emitting efficiency. To improve this situation, a high power bulb may be used as the second light source 24, and reflector 26 may also be used to concentrate the light emitted from the second light source 24 at the inlet end 22 of the light guiding fibers 28 as shown in FIG. 13.

In these cases, because a light source portion including the high power bulb and the reflector 26 may become a large and complex structure, the headlight including the illumination device that uses the light guide element 20 may also become a large and complex structure. In addition, a power consumption of the illumination device using the light guide element 20 may become high, and also the light source portion may generate a large amount of heat.

Moreover, when an LED (light-emitting diode) light source or an HID (high-intensity discharge) lamp is used as the first light source 14 for the headlight, the headlight may emit a bluish white light. On the other hand, the light guide element 20 may emit a reddish white light when a high power incandescent lamp is used as the second light source 24. Accordingly, the conventional illumination device that is composed of the light guide element 20 may not emit light that is harmonious with light emitted from the headlight.

Furthermore, because a general shape of the light guiding fibers 28 used for the light guide element 20 may be circular, the exterior surface 30 that emits light as the conventional illumination device may also become a rounded surface. Thus, when the light guide element 20 is incorporated into the housing 10 of a headlight so as to emit light from the exterior surface 30, because a limited shape of the exterior surface 30 of the light guide element 20 may reduce possibilities for design with respect to the headlight including the illumination device, the conventional structure for the headlight including the illumination device may cause disfigurement, and also may cause difficulties in workability.

The above-referenced Patent Documents and additional Patent Documents are listed below and are hereby incorporated with their English specifications and abstracts in their entireties.

1. Patent Document No. 1: U.S. Pat. No. 5,984,497
2. Patent Document No. 2: U.S. patent application Ser. No. 13/162,151
3. Patent Document No. 3: U.S. patent application Ser. No. 13/284,859
4. Patent Document No. 4: U.S. patent application Ser. No. 13/229,663
5. Patent Document No. 5: co-assigned U.S. patent application Ser. No. 13/358,500
6. Patent Document No. 6: U.S. patent application Ser. No. 12/016,672

The disclosed subject matter has been devised to consider the above and other problems, characteristics and features. Thus, exemplary embodiments of the disclosed subject matter can include vehicle decorative lighting devices which can provide a favorable light distribution having a high visibility and a high visual quality with a simple structure, and which can expand possibilities for design so as to be able to harmonize with various vehicle lamps including a vehicle decorative lighting device.

In addition, exemplary embodiments of the disclosed subject matter can include vehicle decorative lighting devices which can emit various color lights using an LED light source having a low power consumption such that the lighting devices can be incorporated into various vehicle lamps such as a headlight, a turn signal lamp, a stop lamp, etc. In this case, when the vehicle lamp is a headlight such that a white LED light source or an HID bulb is used as a light source, the vehicle decorative lighting device can emit a harmonious white light with light emitted from the headlight so as to be usable as a position lamp and the like. Also, when the vehicle lamp is configured as a stop lamp such that a red LED light source is used as a light source, the vehicle decorative lighting device can emit a harmonious red light with light emitted from the stop lamp so as to be usable as a tail lamp, etc.

SUMMARY

The presently disclosed subject matter has been devised in view of the above and other characteristics, desires, and problems in the conventional art. An aspect of the disclosed subject matter can include vehicle decorative lighting devices which can provide favorable light distribution having a high visibility and a high visual quality with a simple structure such that workability in manufacturing processes can be achieved. The vehicle decorative lighting devices can be formed in various curved shapes such that they fit various vehicle lamps and can be attached to front and/or rear corners of a vehicle. Another aspect of the disclosed subject matter can include providing vehicle lamps including the decorative lighting devices, which can easily incorporate a low beam headlight, a high beam headlight and the like along with the decorative lighting device because the decorative lighting device can have a slender U-shape such that it can be incorporated into a narrow space along a periphery of an opening of a housing. The vehicle decorative lighting devices and vehicle lamps can also emit a harmonious light with respect to light emitted from other components of the vehicle decorative lighting devices and lamps.

According to one aspect of the disclosed subject matter, a vehicle decorative lighting device can include a light guide lens, which includes a first linear portion including a first end surface, linearly extending in an extending direction of the light guide lens and continuously connecting to a first curved portion having a first curvature radius opposite the first end surface and in the extending direction, a second linear portion including a second end surface, linearly extending in the extending direction and continuously connecting to a second curved portion having a second curvature radius opposite the second end surface and in the extending direction, a third linear portion also extending in the extending direction in a substantially linear fashion and continuously connecting between the first curved portion and the second curved portion and in the extending direction of the light guide lens so that an inner surface of the first linear portion faces an inner surface of the second linear portion, and therefore the inner surface and an outer surface of the light guide lens smoothly connecting in order of a substantially planar surface of the first linear portion, a substantially curved surface of the first curved portion, a substantially planar surface of the third linear surface, a substantially curved surface of the second curved portion and a substantially planar surface of the second linear portion from the first end surface to the second end surface, a reference plane thereof formed in a continuous planar shape between the first end surface and the second end surface and being located in parallel with a substantially rear surface of the light guide lens, a front surface of the light guide lens including at least one of the reference plane and a convex surface formed on the reference plane, the rear surface including a plurality of prism faces arranged at an interval in the extending direction of the light guide lens and each of the prism faces extending in a direction substantially perpendicular to the extending direction of the light guide lens while forming a substantially triangular shape in the direction substantially perpendicular to the extending direction.

In addition, the light guide lens can also include a pair of LED light sources, so that each of the light-emitting surfaces of the LED light sources faces a respective one of the first and the second end surfaces. Each of the optical axes of the LED light sources is configured such that each of the LED light sources directs light toward a respective one of the extending directions of the first and the second linear portions. In the above-described exemplary vehicle decorative lighting device, in order to provide a favorable light distribution, the reference surface can intersect with at least a part of the inner surface of the third linear portion at an acute angle and can intersect with at least a part of the outer surface of the third linear portion at an obtuse angle, and at least a part of the front surface of the third linear portion can be formed in a convex shape on the reference plane between the at least the part of the inner surface of the third linear portion and the at least the part of the outer surface of the third linear portion.

In the above-described exemplary vehicle lighting devices, so that light emitted from the LED light sources smoothly moves in the light guide lens, a length in the extending direction of the first linear portion can be longer than that in the extending direction of the second linear portion, and the first curvature radius of the first curved portion can be smaller than the second curvature radius of the second curved portion. The interval of the plurality of prism faces arranged in the extending direction of the light guide lens on the rear surface can also be 0.3 millimeters or less so as to provide a favorable light distribution. Each of the vehicle light devices can further include a reflective sheet being located adjacent at least a part of at least one of the rear surface, the outer surface and the inner surface of the light guide lens in order to improve a light-emitting efficiency.

According to the above-described exemplary vehicle decorative lighting devices, while light emitted from the pair of LED light sources that can emit various color lights moves smoothly in the light guide lens formed in a substantially slender U-shape, which can be incorporated into a narrow space along a periphery of the opening of the housing, the light can be reflected by the rear surface including the plurality of prism faces toward the front surface and can be emitted from the front surface of the light guide lens. In this case, the front surface of the third linear portion of the light guide lens can be configured to emit light frontwards even when the third linear portion located at a side portion of the devices directs toward a side of a vehicle to fit various curved shapes of both front/rear corners of a vehicle. Thus, the disclosed subject matter can provide vehicle decorative lighting devices which can provide a favorable light distribution having a high visibility and a high visual quality with a simple structure, and which can be formed in various curved shapes.

According to another aspect of the disclosed subject matter, a vehicle lamp including the vehicle decorative lighting device can include: a housing having an opening; an outer lens located adjacent the front surface of the vehicle decorative lighting device, and an edge portion of the outer lens located adjacent an edge portion of the opening of the housing; a panel located between the outer lens and the pair of LED light sources of the vehicle decorative lighting device; a lamp room between the housing and the outer lens, and the lamp room including the vehicle decorative lighting device so that the front surface of the light guide lens faces the outer lens; and at least one of a low beam headlight, a high beam headlight, a stop lamp and a turn signal lamp located in the lamp room along with the vehicle decorative lighting device, wherein each of light-emitting directions of the low beam headlight, the high beam headlight, the stop lamp and the turn signal lamp is directed toward the outer lens.

In this case, the panel can extend toward the rear surface of the light guide lens of the vehicle decorative light device so as to be located adjacent the rear surface of the light guide lens to return light leaked from the light guide lens into the light guide lens. Each of a low beam light source of the low beam headlight and a high beam light source of the high beam headlight can be at least one of an HID bulb and a white LED light source so that the headlight can emit a harmonious white light with a white light emitted from the vehicle decorative lighting device as a position lamp. In addition, when the vehicle lamp is used as a headlight, the headlight can be a projector type headlight including a projector lens in the lamp room, and also can be a reflector type headlight including at least one reflector in the lamp room.

According to another aspect of the disclosed subject matter, the exemplary vehicle lamps can incorporate various vehicle lamps such as a headlight and the like along with the vehicle decorative lighting device, which can be incorporated into a narrow space along a periphery of the opening of the housing in the lamp room, and which can various color lights using the LED light sources. Thus, the disclosed subject matter can also provide vehicle lamps including the vehicle decorative lighting devices, which can easily incorporate a low beam headlight, a high beam headlight and the like along with the decorative lighting device, and which can also emit a harmonious light with light emitted from the vehicle decorative lighting device.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
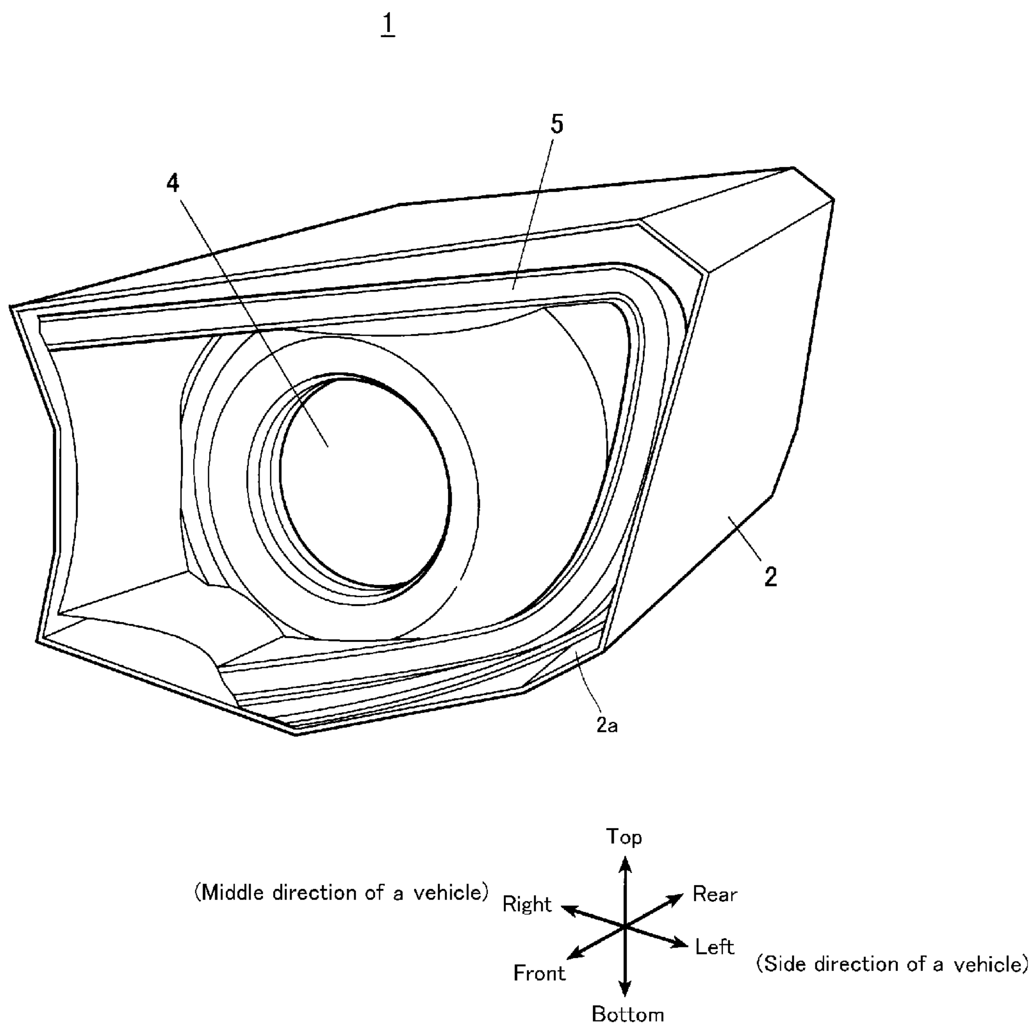
FIG. 1 is a perspective view showing a first exemplary embodiment of a vehicle lamp including a vehicle decorative lighting device made in accordance with principles of the disclosed subject matter.

The disclosed subject matter will now be described in detail with reference to FIGS. 1 to 11, in which the same, similar, or corresponding elements use the same reference marks. FIG. 1 is a perspective view showing a first exemplary embodiment of a vehicle lamp including a vehicle decorative lighting device made in accordance with principles of the disclosed subject matter. The vehicle lamp 1 can incorporate a vehicle headlight 4 along with the vehicle decorative lighting device in a lamp room thereof, which can be attached to a front and left portion of a vehicle. Another vehicle headlight attached to a front and right portion of the vehicle can be symmetrical to the vehicle headlight 4.

The vehicle lamp 1 can include: a housing 2 having an opening 2*a* in a light-emitting direction of the vehicle lamp 1, and the opening 2*a* inclining from a right (a middle direction of a vehicle) toward a left (a side direction of a vehicle) in an upper right direction from a front view of the vehicle lamp 1 and inclining in a rear direction of the vehicle lamp 1 from a side view of the vehicle lamp 1; an outer lens (not shown in FIG. 1) covering the opening of the housing 2; a lamp room located between the outer lens and the housing 2; a headlight unit 4 located in the lamp room so as to emit light in the light-emitting direction of the vehicle lamp 1 via the outer lens; and also a light guide lens 5 located in the lamp room and along a periphery of the opening of the housing 2 so as to emit light via the outer lens.

Figure 2:
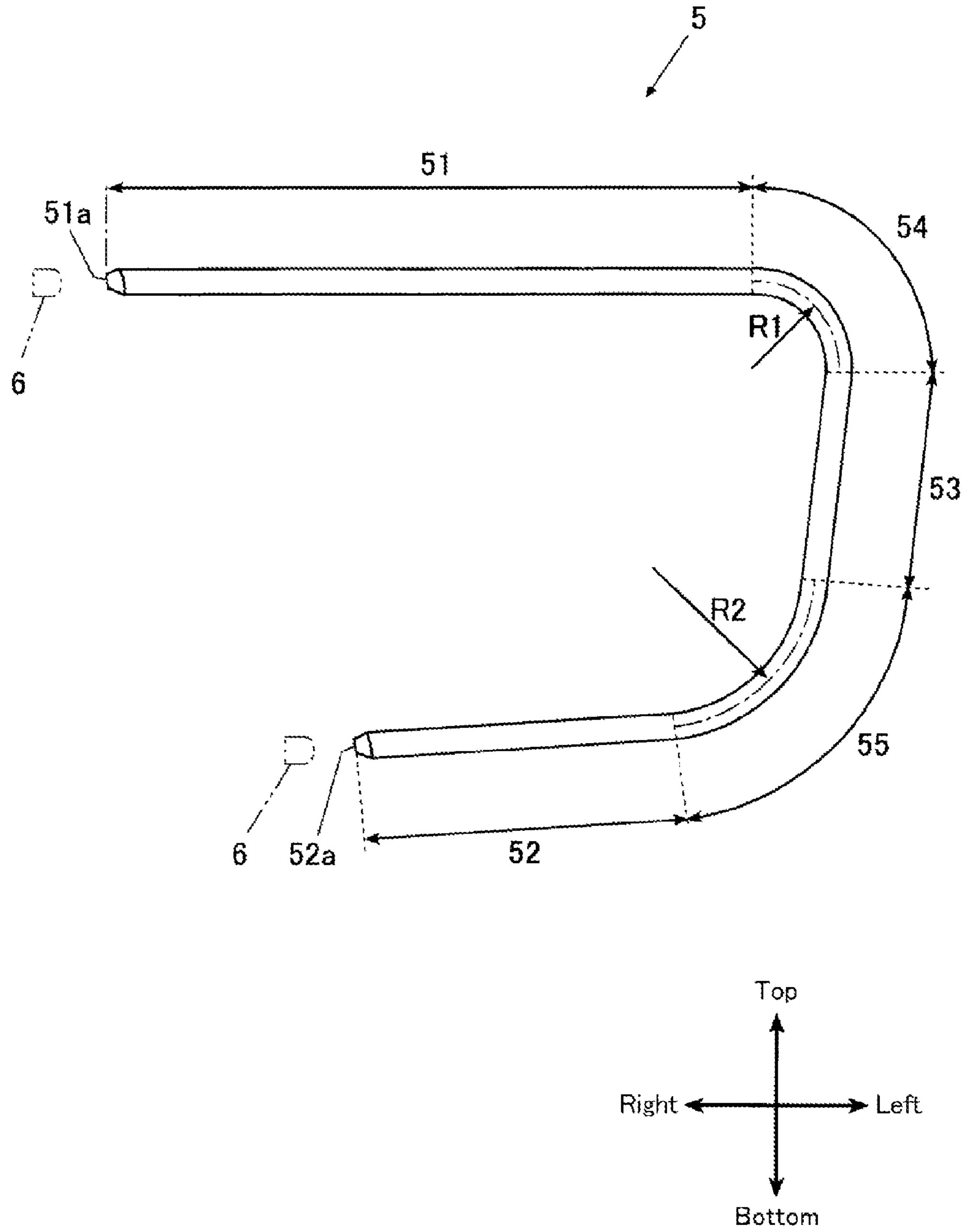
FIG. 2 is a schematic front view showing the vehicle decorative lighting device, which is incorporated into the vehicle lamp shown in FIG. 1.

FIG. 2 is a schematic front view showing the vehicle decorative lighting device, which is incorporated into the vehicle lamp 1 shown in FIG. 1. The vehicle decorative light device can include the light guide lens 5 having a first end surface 51*a* and a second end surface 52*a*, which is formed in a substantially slender U-shape, and a pair of light sources 6 located at the first and second end surfaces 51*a* and 52*a* so that each of lighting-emitting surfaces of the light sources 6 faces a respective one of the first and second end surfaces 51*a* and 52*a*.

As each of the pair of light sources 6, an LED (light-emitting diode) light source such as a white LED light source, a yellow LED light source, an amber LED light source, a red LED light source and the like can be used depending on the intended use of the decorative lighting device. For example, semiconductor light-emitting devices that can emit various color lights as disclosed in Patent Document No. 2 can be used as the LED light source.

The LED light source can emit light having a high light-intensity with a low power consumption, and also can be provided with a light-emitting surface having various shapes that match each shape of the first and second end surfaces 51*a* and 52*a* of the light guide lens 5. Accordingly, when an optical axis of the LED light source corresponds to each center of the first and second end surfaces 51*a* and 52*a*, light emitted from the LED light source can enter into the light guide lens 5 via the first and second end surface 51*a* and 52*a* with a higher efficiency.

Therefore, because the vehicle decorative lighting device of the disclosed subject matter does not need a reflector to concentrate light at the first and second end surfaces 51*a* and 52*a* of the light guide lens 5 as compared with the conventional headlight including the illumination device, the headlight including the vehicle decorative lighting device can become a small and simple structure. In addition, a power consumption of the vehicle decorative light device can be significantly reduced as compared with conventional illumination devices, because a power consumption of the LED light source is lower than that of an incandescent lamp or a gas discharge lamp.

The light guide lens 5 can be composed a transparent resin such as an acrylic resin, a polycarbonate resin, a polyester resin, a polyolefin resin and the like. The light guide lens 5, which is formed in a substantially laterally-facing U-shape, can include: a first linear portion 51 having the first end surface 51*a* located at a top portion of the light guide lens 5 and linearly extending in an extending direction of the light guide lens 5 (the extending direction being relative to the light guide lens 5 itself and therefore extending along a longitudinal axis thereof at any given specific location thereof); a second linear portion 52 having the second end surface 52 located at a bottom portion of the light guide lens 5 and linearly extending in the extending direction of the light guide lens 5; a first curved portion 54 having a first curvature radius R1 at a central axis thereof continuously connecting to the first linear portion 51 and extending toward the second linear portion 52; a second curved portion 55 having a second curvature radius R2 at a central axis thereof continuously connecting to the second linear portion 52 and extending toward the first curved portion 54; and a third linear portion 53 linearly extending in the extending direction of the light guide lens 5, and continuously connected between the first curved portion 54 and the second curved portion 55 so as to extend in a top and bottom direction of the light guide lens 5, wherein the first portion 51 is longer than the second portion 52, and the first curvature radius R1 of the first curved portion 54 is smaller than the second curvature radius R2 of the second curved portion 55.

Therefore, each segment or portion of an inner surface of the light guide lens 5 can smoothly connect to an adjacent segment or portion in the following order: a substantially planar surface of the first linear portion 51, a substantially curved surface of the first curved portion 54, a substantially planar surface of the third linear surface 53, a substantially curved surface of the second curved portion 55 and a substantially planar surface of the second linear portion 52 from the first end surface 51*a* to the second end surface 52*a* so that the inner surfaces of the first linear portion 51 and the second linear portion 52 face each other.

Similarly, each segment or portion of an outer surface of the light guide lens 5 can also smoothly connect to an adjacent segment or portion in the following order: a substantially planar surface of the first linear portion 51, a substantially curved surface of the first curved portion 54, a substantially planar surface of the third linear surface 53, a substantially curved surface of the second curved portion 55 and a substantially planar surface of the second linear portion 52 from the first end surface 51*a* to the second end surface 52*a* so as to be located opposite the inner surface of the light guide lens 5.

The outer surface of the light guide lens 5 can be parallel to the inner surface of the light guide lens 5. However, the outer surface and the inner surface of the light guide lens 5 may not necessarily be parallel with respect to each other, especially between the first curved portion 54 and the second curved portion 55 as described later. Each of the first and second end surfaces 51*a* and 52*a* can be formed in a planar shape so as to be substantially perpendicular to the outer surface and the inner surface of the light guide lens 5 in order for the light guide lens 5 to efficiently receive light emitted from the pair of light sources 6. Each of the first and second end surfaces 51*a* and 52*a* can be also formed in a concave shape so as to fit each shape of light-emitting surfaces of the light sources 6.

Figure 3:
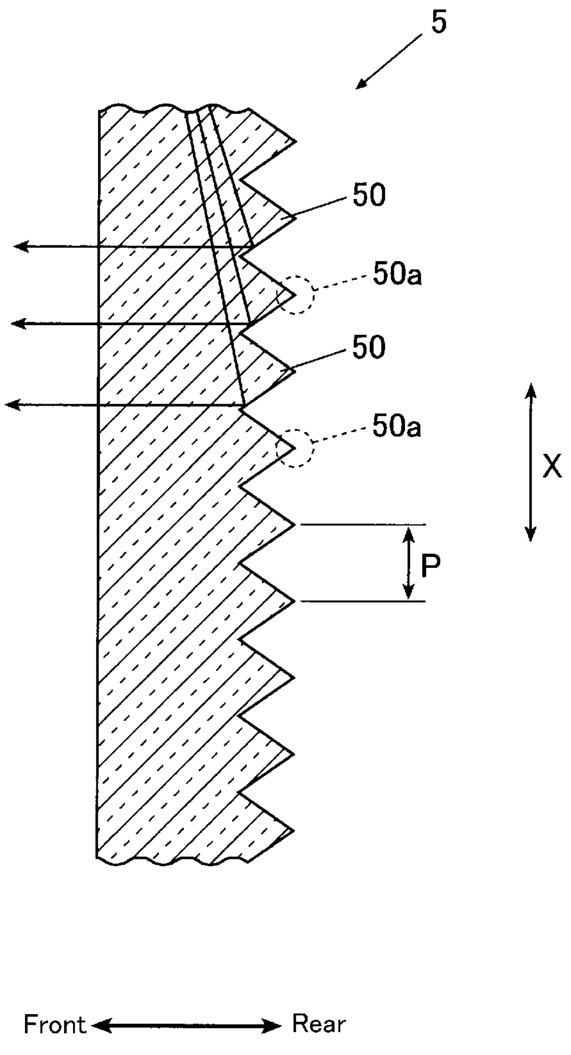
FIG. 3 is a partial enlarged cross-sectional view depicting a light guide lens used for the vehicle decorative lighting device shown in FIG. 2, wherein the cross-sectional view is a partial enlarged view in an extending direction X of the light guide lens.

FIG. 3 is a partial enlarged cross-sectional view depicting the light guide lens 5 used for the decorative lighting device, wherein the cross-sectional view is a partial enlarged view in the extending direction X of the light guide lens 5 between the first and second end surfaces 51*a* and 52*a* (shown in FIG. 2). A cross-sectional shape of the light guide lens 5 in a direction perpendicular to the extending direction X can be substantially rectangular. Accordingly, a front surface of the light guide lens 5, which faces the outer lens as described in FIG. 1, can be formed in a substantially planar shape between the first and second end surfaces 51*a* and 52*a* so as to be parallel to a substantially rear surface of the light guide lens 5, which is located opposite the front surface.

However, the light guide lens 5 can include a plurality of prism faces 50 on the rear surface, which is formed in a substantially planar shape, as shown in FIG. 3. The plurality of prism faces 50 can be arranged in the extending direction X of the light guide lens 5, and each of the prism faces 50 can extend in the direction perpendicular to the extending direction X. Each cross-sectional shape of the prism faces 50 in the extending direction X of the light guide lens 5 can be formed in a substantially triangle shape having an apex 50*a*, and a pitch P between adjacent apexes 50*a* of the plurality of the prism faces 50 can be 0.3 millimeters or less.

Figure 4:
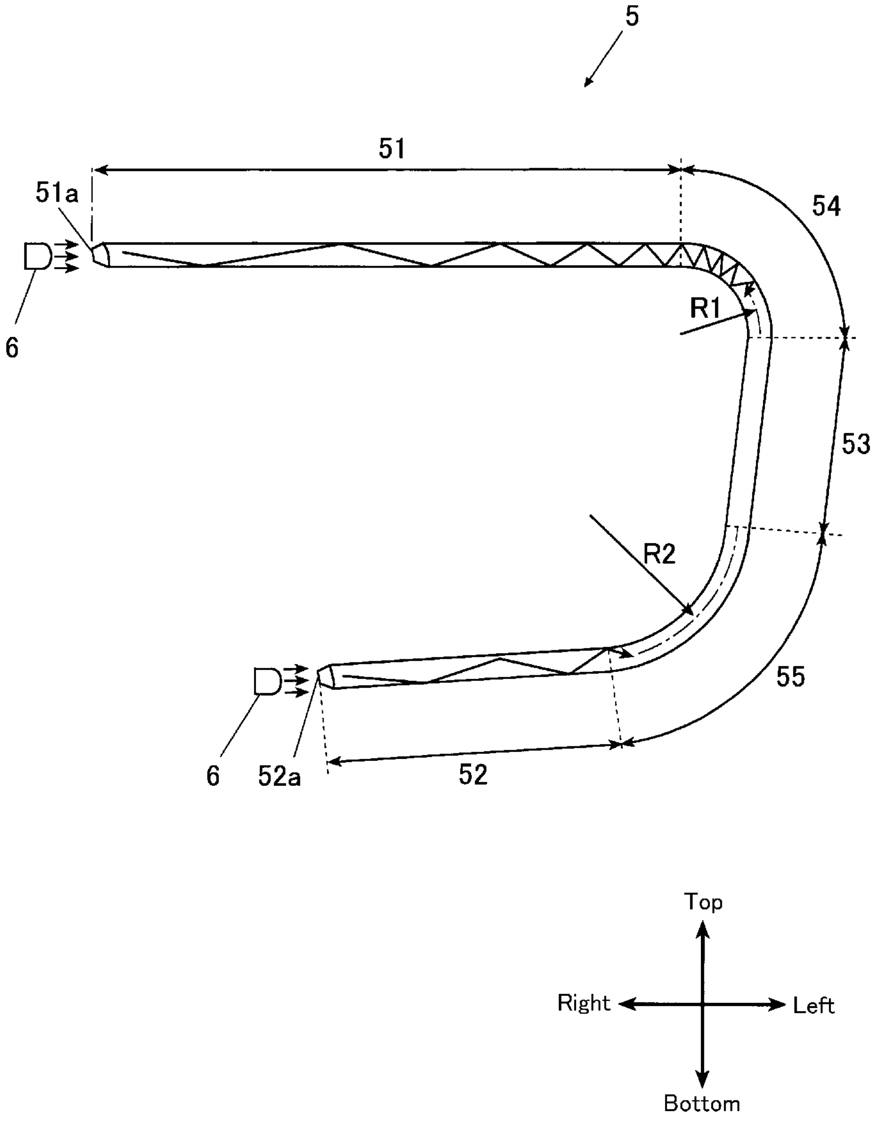
FIG. 4 is an explanatory drawing depicting a light ray trajectory in the light guide lens of the vehicle decorative lighting device shown in FIG. 2.

FIG. 4 is an explanatory drawing depicting a light ray trajectory in the light guide lens 5 of the vehicle decorative lighting device with respect to light emitted from the light sources 6. The light emitted from the light sources 6 can enter into the light guide lens 5 from each of the first and second end surfaces 51*a* and 52*a*, and can move in the extending direction X of the light guide lens 5 while it repeats internal reflections in the light guide lens 5. In this case, the light emitted from the light sources 6 can be reflected by the prism faces 50, which are arranged in the extending direction X, and can be emitted from the front surface of the light guide lens 5 and over the entire length of the light guide lens 5.

Thereby, the light guide lens 5 which is located along the periphery of the opening of the housing 2 as shown in FIG. 1, can provide a light distribution as the vehicle decorative lighting unit via the outer lens from the front surface of the light guide lens 5, which is the light-emitting surface of the vehicle decorative lighting device. In this case, as light that has entered into the light guide lens 5 from each of the first and second end surfaces 51*a* and 52*a* repeats the internal reflections in the first linear portion 51 and the second linear portion 52, a primary light flux having a larger incident angle in a moving direction of the light may relatively decrease in the moving light, and a secondary light flux having a smaller incident angle in the moving direction of the light may relatively increase in the moving light.

Hence, light that has entered into the first linear portion 51 from the first end surface 51*a* can move in the first linear portion 51, in which a length in the extending direction X of the first linear portion 51 is longer than that of the second linear portion 52, and therefore can enter into the first curved portion 54 in a state such that a ratio of the secondary light flux to the primary light flux is relatively large. As a result, the light that has entered into the first linear portion 51 from the first end surface 51*a* can smoothly move in the first curved portion 54 while preventing a leaked light from the first curved portion 54 in spite of a structure that the first curved portion 54 includes a small curvature radius such as the first curvature radius R1, and the light can be efficiently emitted from the front surface of the first curved portion 54 having the curvature radius R1.

Meanwhile, light that has entered into the second linear portion 52 from the second end surface 52*a* can move in the second linear portion 52, in which a length in the extending direction X of the second linear portion 52 is shorter than that of the first linear portion 51, and therefore can enter into the second curved portion 55 in a state such that a ratio of the secondary light flux to the primary light flux is relatively small. However, the light that has entered into the second linear portion 52 from the second end surface 52*a* can smoothly move in the second curved portion 55 while preventing a leaked light from the second curved portion 55 because the second curvature radius R2 of the second curved portion 55 is relatively large, and the light can be efficiently emitted from the front surface of the second curved portion 55 having the curvature radius R2.

As described above, in order to emit light in a substantially same direction as the light-emitting direction of the vehicle lamp 1 from the front surface of the light guide lens 5, the light guide lens 5 can include the plurality of prism faces 50 on the rear surface thereof, and the prism faces 50 can be arranged in the extending direction X of the light guide lens 5. However, light entering into the first and second linear portions 51 and 52 from the first and second end surfaces 51 and 52*a* may have difficulty reaching the apexes 50*a* of the prism faces 50.

Consequently, when the light guide lens 5 is viewed from right in front of the front surface of the light guide lens 5 during turning on the light sources 6, portions on the front surface in front of the apexes 50*a* may become slightly darker than other portions on the front surface of the light guide lens 5. However, when the pitch P between the adjacent apexes 50*a* of the prism faces 50 is 0.3 millimeters or less, the light guide lens 5 can provide a substantially uniform light from the front surface thereof without a dark region such as a fringe.

The reason why the light guide lens 5 can provide substantially uniform light will now be described with reference to an examination theory for visual acuity. According to an examination for visual acuity using a C-shaped Landolt ring, VA (visual acuity) is defined as the reciprocal of a minimum visual angle (arc-minute). When a chasm of 1.5 millimeters between C-shaped ring can be discerned from 5 meters away, VA is defined as 1.0. Accordingly, a chasm width that can be discerned from 1 meter away by a human eye having VA of 1.0 may become 0.3 millimeters (1.5 millimeters/5 meters×1 meter).

According to the above understanding, when the human eye having VA of 1.0 sees the light guide lens 5 from 1 meter away, a width of a visible minimum dark region may become 0.3 millimeters. If the pitch P between the adjacent apexes 50*a* is 0.3 millimeters or less, the width of the dark region can become narrower than the pitch P because the width of the dark region cannot become wider than the pitch P.

Therefore, when the pitch P between the adjacent apexes 50*a* is 0.3 millimeters or less, it can be very difficult to discern the dark region that may be formed on the front surface in front of the apexes 50*a* of the light guide lens 5 even when the human eye having VA of 1.0 sees the light guide lens 5 from 1 meter away. As a result, the light guide lens 5 can provide a uniform favorable light distribution from the front surface thereof, which is the light-emitting surface for the vehicle decorative lighting device.

In addition, pedestrians, who walk by the side of vehicles, scarcely look at the light guide lens 5 at very close range from 1 meter away, and the dark region may be inarticulately viewed in the light guide lens 5, which is an optical lighting unit including an optical member. Thus, when the pitch P between the adjacent apexes 50*a* is 0.3 millimeters or less, pedestrians and other drivers can enjoy a pleasing light-emission pattern.

Figure 5:
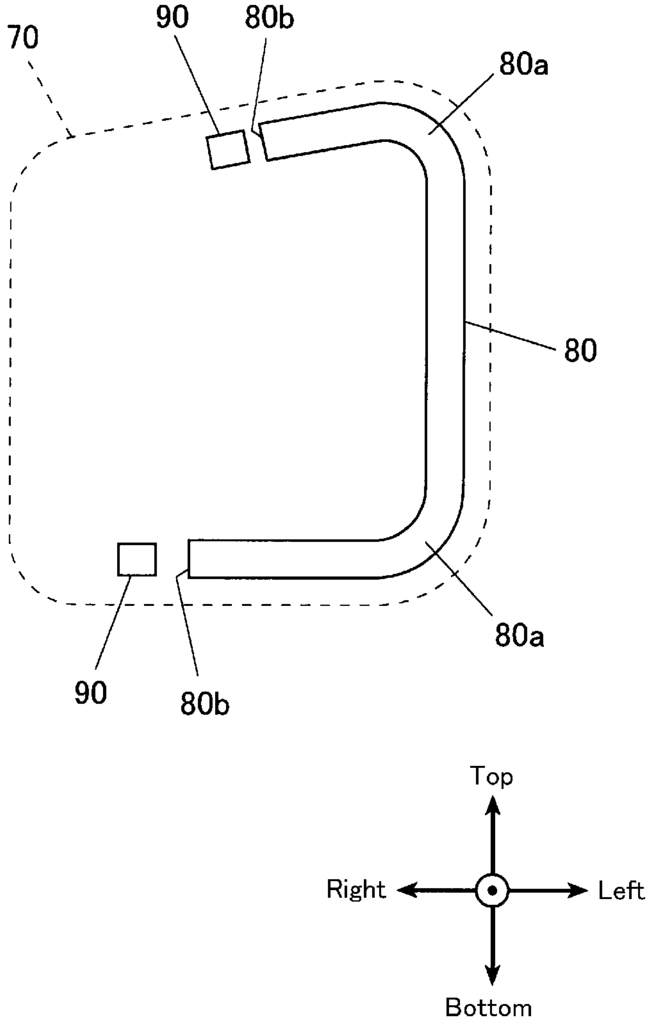
FIG. 5 is a partial enlarged cross-sectional view depicting a comparative embodiment of the vehicle decorative lighting device shown in FIG. 2.

FIG. 5 is a partial enlarged cross-sectional view depicting a comparative embodiment of the vehicle decorative lighting device shown in FIG. 2. The comparative embodiment 70 includes a light guide lens 80 having both end surfaces 80*b*, which is formed in a substantially laterally-facing U-shape having two curved portions 80*a*, and a pair of light sources 90 located at the both end surfaces 50*b* so that each of lighting-emitting surfaces of the light sources 90 faces a respective one of the both end surfaces 80*b*.

A difference between the comparative embodiment 70 and the embodiment described in FIG. 1-4 of the vehicle decorative lighting device relates to the light guide lens 80, in which each of the two curved portions 80*a* has a same curvature radius, and each length in an extending direction of two linear portions between the two curved portions 80*a* and the both end surfaces 80*b* is different so that a first linear portion located at a top portion of the light guide lens 80 is shorter than a second linear portion located at a bottom portion.

In the comparative embodiment, light that has entered into the second linear portion from one of the end surfaces 80*b*, which is located at the bottom portion of the light guide lens 80*b*, may move in the second linear portion, in which a length in the extending direction of the second linear portion is longer than that of the first linear portion located at the top portion, and therefore may enter into one of the curved portions 80*a* located at the bottom portion in a state that a ratio of the secondary light flux to the primary light flux is relatively large.

However, light that has entered into the first linear portion from another one of the end surfaces 80*b*, which is located at the top portion of the light guide lens 80, may move in the first linear portion, in which a length in the extending direction of the first linear portion is shorter than that of the second linear portion located at the bottom portion. Therefore the light that has entered into the first linear portion may enter into another one of the curved portions 80*b* located at the top portion in a state that a ratio of the secondary light flux to the primary light flux is smaller as compared with the light that has entered into the one of the curved portions 80*a* located at the bottom portion.

Hence, each of the light rays that enters into the curved portions 80*b* from the end surfaces 80*b* may vary the ratio of the secondary light flux to the primary light flux in accordance with the length of the linear portion in the extending direction of the light guide lens 80. Additionally, an amount of light leaked out of the light guide lens 80 may be easy to increase in light having a higher ratio of the primary light flux to the secondary light flux than light having a low ratio of the primary light flux to the secondary light flux in the light rays that enter into the curved portions 80*b*.

In the light rays entering into the curved portions 80*b*, light having a higher ratio of the secondary light flux to the primary light flux than light having a low ratio of the secondary light flux to the primary light flux may be easy to smoothly move in each of the curved portions 80*b*. Accordingly, a light-emitting intensity emitted from a front surface of the one of the curved portions 80*a* located at the bottom portion may be somewhat higher than that emitted from a front surface of the other one of the curved portions 80*a*, which is located at the top portion of the light guide lens 80, and thereby a variation of the light intensity may occur in the light guide lens 80 in the comparative embodiment.

To improve this problem in the comparative embodiment, the light guide lens 80 can be provided with a reflective sheet on at least one of the rear surface, an outer surface located adjacent the housing 2 of the vehicle lamp 1 and an inner surface opposite the outer surface so that the light emitted from the light sources 90 can smoothly move in the light guide lens 80 while it repeats internal reflections and also can be efficiently emitted from the front surface, which is a light-emitting surface of the light guide lens 80. The reflective sheet can be made of a material having high reflectivity, such as polyethylene terephthalate (PET) and the like, as disclosed in Patent Document No. 3.

In addition, the front surface of the light-emitting surface can also be formed in a convex shape in order to diffuse light that gets to the front surface of the light guide lens 80. In this case, the above-described planar front surface is defined as a reference plane, and the front surface can be formed in the convex shape on the reference plane. Accordingly, the front surface of the light guide lens 80, which is the light-emitting surface of the light guide lens 80, can be formed in at least one of the planar surface and the convex surface located on the reference plane.

Thereby, the light guide lens 80 of the comparative embodiment can also provide a favorable light distribution such that is similar to the light distribution formed by the light guide lens 5 of the first embodiment. Moreover, the above-described structures in regard to the light-emitting surface including the convex surface and the reflective sheet can be utilized in the light guide lens 5 of the first embodiment in accordance with an outside appearance, a use and the like of the vehicle lamp 1. The vehicle decorative lighting device of the disclosed subject matter can expand a design possibility of the lighting device so as to fix various requirements of the vehicle lamp 1 by using the disclosed structures.

According to the first embodiment as described above, light emitted from the pair of LED light sources that can emit various color lights can smoothly move in the light guide lens 5 formed in a substantially slender U-shape, which can be incorporated into a narrow space along the periphery of the opening of the housing 2, and the light can be reflected by the rear surface including the plurality of prism faces 50 toward the front surface and can be emitted from the front surface of the light guide lens 5. Thus, the disclosed subject matter can provide vehicle decorative lighting devices which can emit various color lights using an LED light source having a low power consumption such that the lighting devices can be incorporated into various vehicle lamps such as a headlight, a turn signal lamp, a stop lamp and the like. These vehicle lamps can have favorable light distribution patterns, have high visibility and high visual quality while providing simple structures allowing ease of manufacturing as compared with the conventional illumination device.

Figure 6:
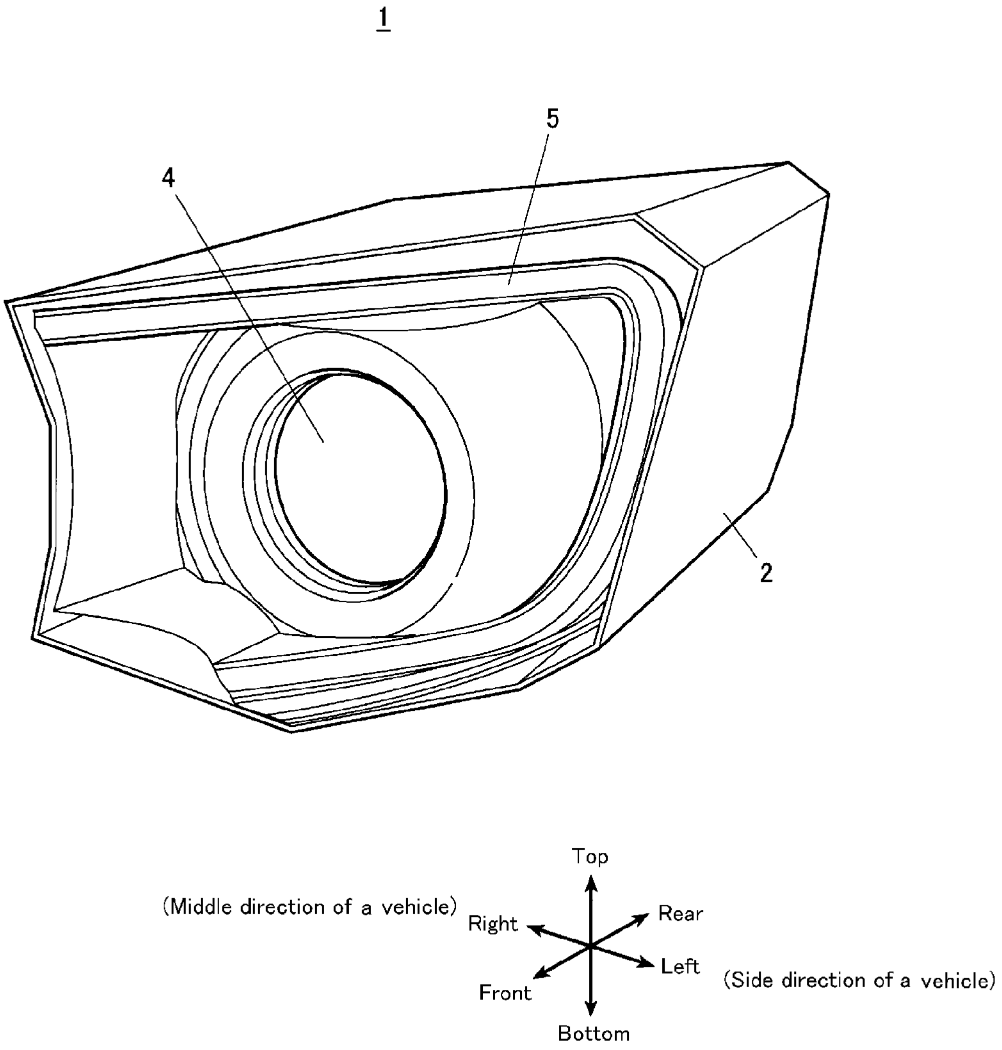
FIG. 6 is a perspective view showing a second exemplary embodiment of the vehicle lamp including the vehicle decorative lighting device made in accordance with principles of the disclosed subject matter.

FIG. 6 is a perspective view showing another exemplary embodiment of the vehicle lamp including the vehicle decorative lighting device made in accordance with principles of the disclosed subject matter. A difference between this embodiment and the earlier described embodiment of the vehicle lamp 1 relates to a curved shape of the housing 2. In the embodiment of FIG. 6 of the vehicle lamp 1, an opening 2*a* of a housing 2 can incline from a right (a middle direction of a vehicle) toward a left (a side direction of a vehicle) in an upper right direction from a front view of the vehicle lamp 1 and also can incline in a rear direction of the vehicle lamp 1 from a side view of the vehicle lamp 1 in common with the earlier embodiment, and further can bend from the right toward the left so that the opening can be exposed from a front toward a side of the vehicle lamp 1 in this later embodiment.

This is because the embodiment of FIG. 6 of the vehicle lamp 1 is a match for a design of a vehicle. In this case, if the structure of the light guide lens 5 of the earlier embodiment shown in FIG. 2 is used for a light guide lens 5 of the later embodiment, because the third linear portion located between the curved portions may direct in the side direction of the vehicle, the third linear portion may be difficult to clearly illuminate the front of the vehicle.

Figure 7:
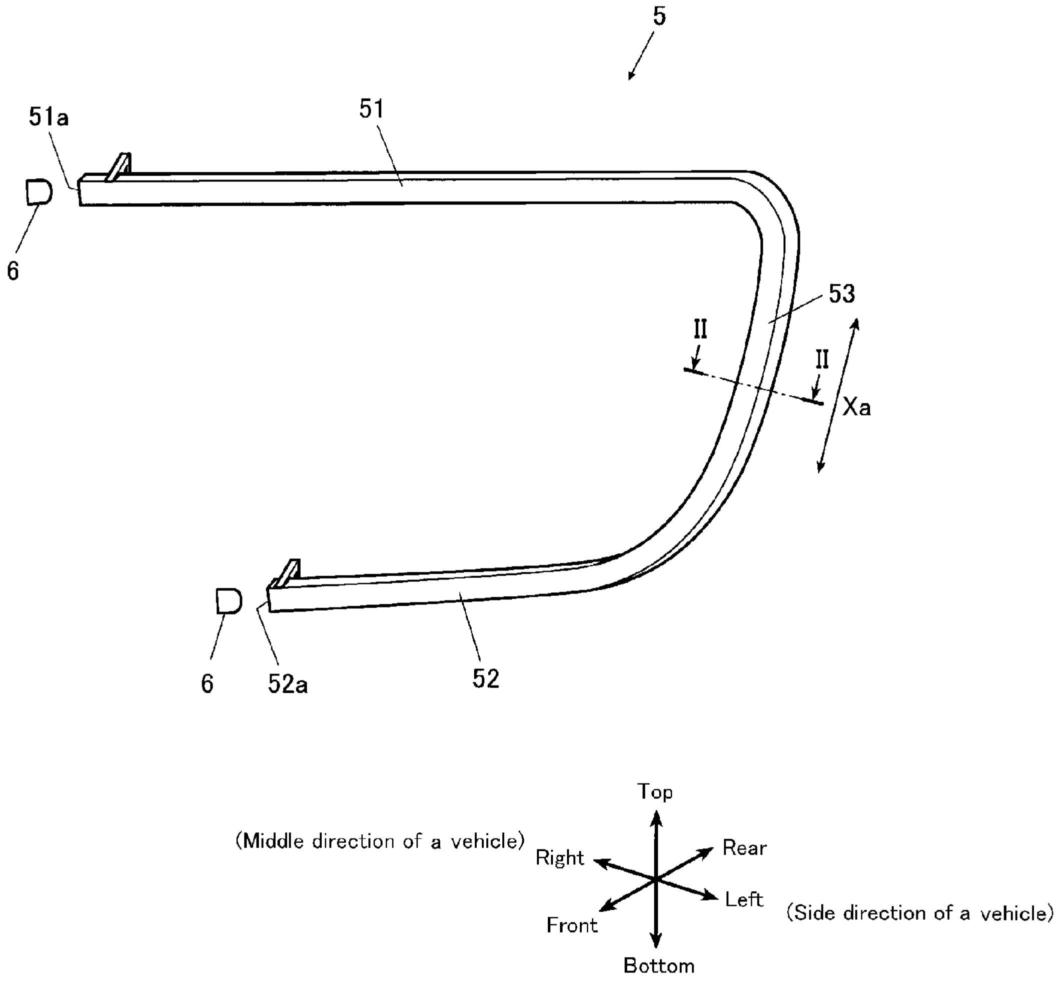
FIG. 7 is a schematic front view showing the decorative lighting device used for the vehicle lamp shown in FIG. 6.

To avoid such a problem in the embodiment of FIG. 6, a structure of the third linear portion 53 of the earlier embodiment can be modified in the light guide lens 5 of the embodiment of FIG. 6 so as to harmonize with the vehicle lamp 1 of the FIG. 6 embodiment. FIG. 7 is a schematic front view showing the vehicle decorative lighting device used for the vehicle lamp 1 shown in FIG. 6. The vehicle decorative light device can include the light guide lens 5 having a first end surface 51*a* and a second end surface 52*a*, which is formed in a substantially slender U-shape, and a pair of light sources 6 located at the first and second end surfaces 51*a* and 52*a* so that each of lighting-emitting surfaces of the light sources 6 faces a respective one of the first and second end surfaces 51*a* and 52*a* in common with the first embodiment.

The light guide lens 5 can include: a first linear portion 51 having the first end surface 51*a* and linearly extending in an extending direction Xa of the light guide lens 5; a second linear portion 52 having the second end surface 52*a* and linearly extending in the extending direction Xa of the light guide lens 5; a first curved portion having a first curvature radius continuously connecting to the first linear portion 51 and extending toward the second linear portion 52; a second curved portion 55 having a second curvature radius continuously connecting to the second linear portion 52 and extending toward the first curved portion 54; and a third linear portion 53 continuously connected between the first curved portion 54 and the second curved portion 55 so as to extend in an extending direction Xa of the light guide lens 5.

Figure 8:
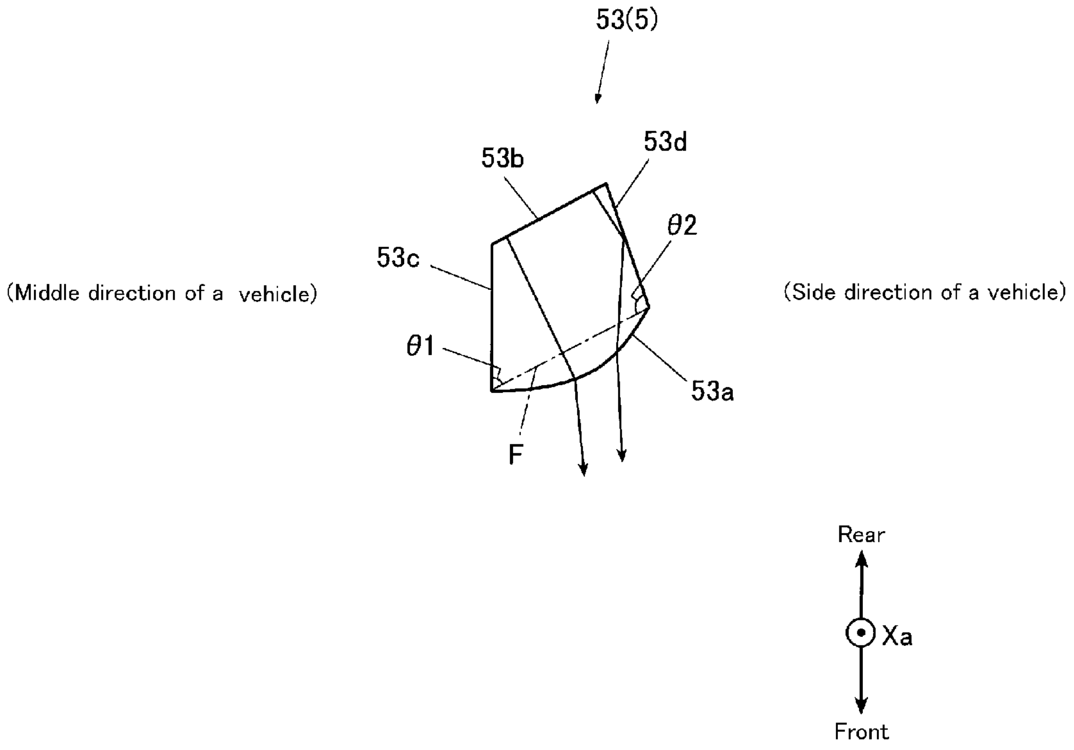
FIG. 8 is a cross-sectional structural view showing a light guide lens taken along line II-II shown in FIG. 7, wherein line II-II is perpendicular to an extending direction Xa of the light guide lens.

FIG. 8 is a cross-sectional structural view showing a light guide lens taken along line II-II shown in FIG. 6, in which line II-II is perpendicular to the extending direction Xa of the light guide lens 5. The third linear portion 53 can include at least one of a front surface 53*a* and a reference plane F. The at least one of the front surface 53*a* and the reference plane F of the third linear portion 53 can be formed in a substantially continuous planar shape in the extending direction Xa and also can be located in parallel with a substantially rear surface 53*b*, which includes the plurality of prism faces 50 arranged in the extending direction Xa of the light guide lens 5 as shown in FIG. 3.

In this case, when the reference plane F intersects with at least a part of an inner surface 53*c* of the third linear portion 53 at an acute angle $\theta 1$ and also can intersect with at least a part of an outer surface 53*d* of the third linear portion 53 at an obtuse angle $\theta 2$, at least a part of the front surface 53*a* of the third linear portion 53 can be formed in a convex shape on the reference plane F between the at least the part of the inner surface 53*c* and the at least the part of the outer surface 53*d* as the front surface 53*a* of the third linear portion 53, which is a light-emitting surface of the third linear portion 53 of the light guide lens 5.

According to the above-described second embodiment, light emitted from the light sources 6 can enter into the light guide lens 5 from each of the first and second end surfaces 51*a* and 52*a*, and can move in the extending direction Xa of the light guide lens 5 while it repeats internal reflections in the light guide lens 5. In this case, the light emitted from the light sources 6 can be reflected by the prism faces 50, which are arranged in the extending direction Xa, and can be emitted from the front surface of the light guide lens 5 and over the entire length of the light guide lens 5.

In this case, because the reference plane F intersects at least a portion of the outer surface 53*d* of the third linear portion 53 at an obtuse angle θ2, at least the part of the front surface 53*a* of the third linear portion 53 can intersect with the outer surface 53 at a larger angle than the obtuse angle θ2 in the third linear portion 53 of the light guide lens 5. Accordingly, because the outer surface 53*d* intersects with the rear surface 53*b* at an acute angle, a part of light reflected by the prism surfaces 50 of the rear surface 53*b* can move toward the outer surface 53*d* and can be reflected on the outer surface 53*d* toward the front surface 53*a* as shown by an arrow in FIG. 8. Thereby, even when the rear surface 53*b* directs toward the side direction of a vehicle, the light guide lens 5 of this embodiment can increase an amount of light emitted from the front surface 53*a* of the third linear portion 53 toward the front of the vehicle as compared with that of the first embodiment.

Figure 9:
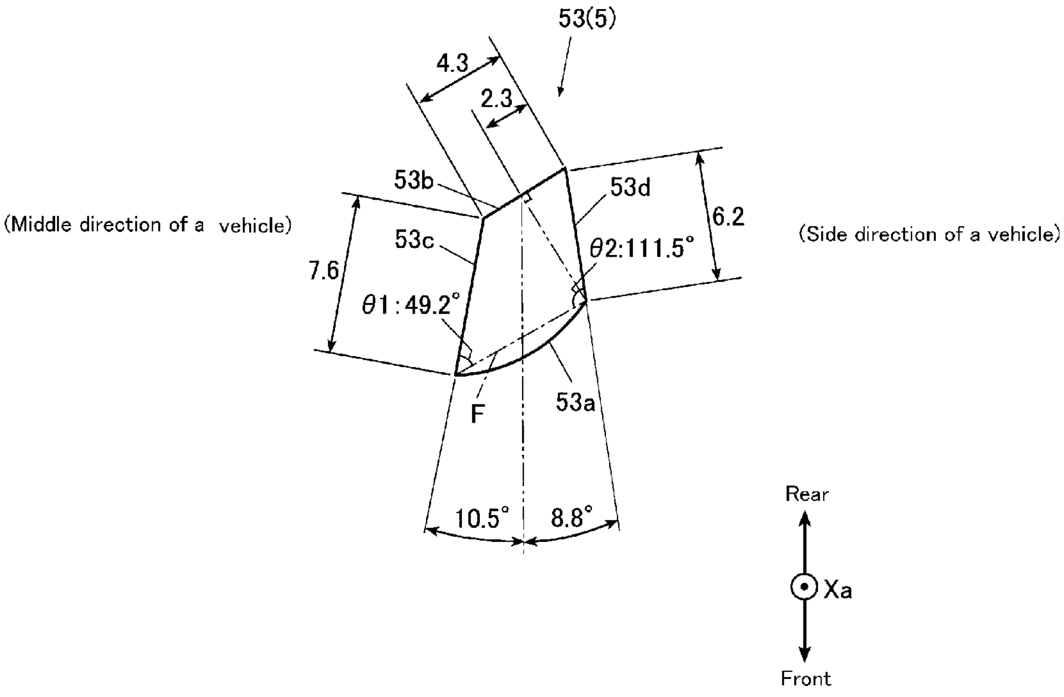
FIG. 9 is a cross-sectional structural view showing an exemplary specific shape of the light guide lens shown in FIG. 8.

FIG. 9 is a cross-sectional structural view showing an exemplary specific shape of the light guide lens 5 shown in FIG. 8. According to the specific shape, on a width of 4.3 millimeters of the rear surface 53*b*, a portion of 2.3 millimeters may reflect light toward the outer surface 53*d* and the light may be emitted from the front surface 53*a*, which is formed in a convex shape. An amount of the light may become 53.4 percents (2.3/4.3×100=53.4%) of light reflected on the rear surface 53*b*.

In addition, the front surface 53*a* of the third linear portion 53 of the light guide lens 5 can be formed in a convex shape on the reference plane F, and therefore can diffuse light that gets to the front surface 53 in a horizontal direction. Moreover, because the front surface 53*a* intersects with the inner surface 53*c* so that the reference plane F intersects the inner surface 53*c* at the acute angle θ1, a portion of the front surface 53*a* located toward the inner surface 53*c* can direct light toward the front of the vehicle. Therefore, a visibility of the vehicle decorative lighting device from the front view of the vehicle can improve as compared with the structure of the earlier embodiment.

According the above-described embodiment, while light emitted from the pair of LED light sources can smoothly move in the light guide lens 5 that is formed in a substantially slender U-shape such that can be incorporated into a narrow space along a periphery of the opening of the housing 2, the light can be reflected by the rear surface including the plurality of prism faces 50 toward the front surface and can be emitted from the front surface of the light guide lens 5. In this case, the front surface of the third linear portion 53 of the light guide lens 5 can be configured to emit light frontwards even when the third linear portion 53 located at a side portion of the decorative lighting device directs toward a side of a vehicle so as to fit various curved shapes of both front/rear corners of a vehicle. Thus, the disclosed subject matter can provide vehicle decorative lighting devices which can provide a favorable light distribution having a high visibility and a high visual quality with a simple structure, and which can be formed in various curved shapes in accordance with a shape of the vehicle lamp 1.

Figure 10:
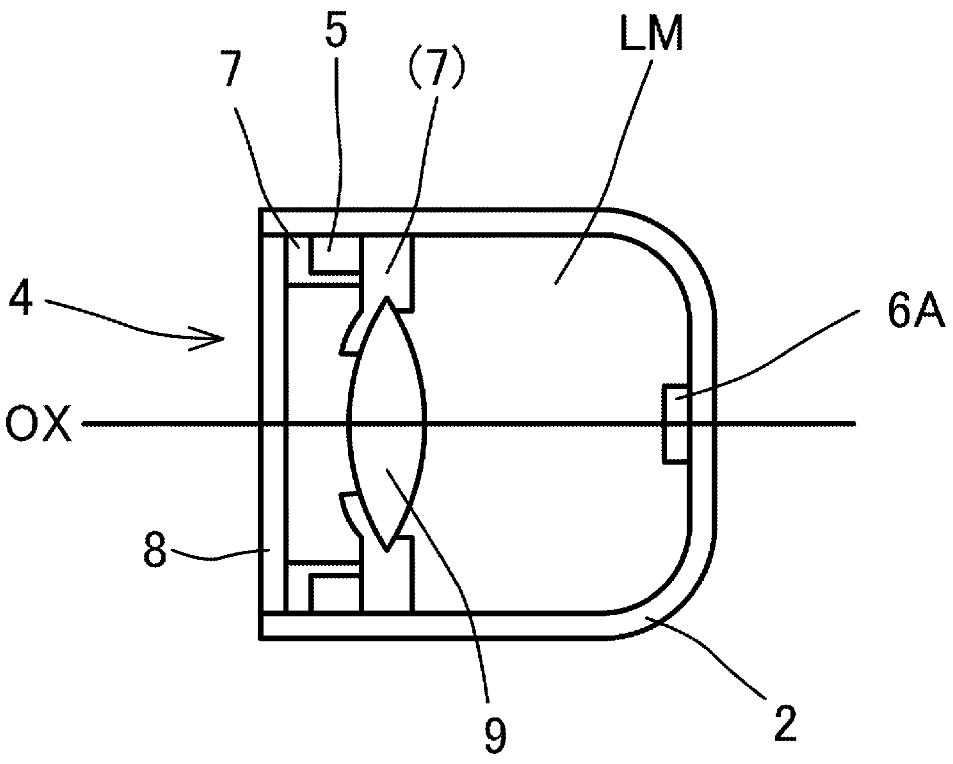
FIG. 10 is a cross-sectional structural view depicting an exemplary embodiment of a headlight including the vehicle decorative lighting device made in accordance with principles of the disclosed subject matter.
Figure 11:
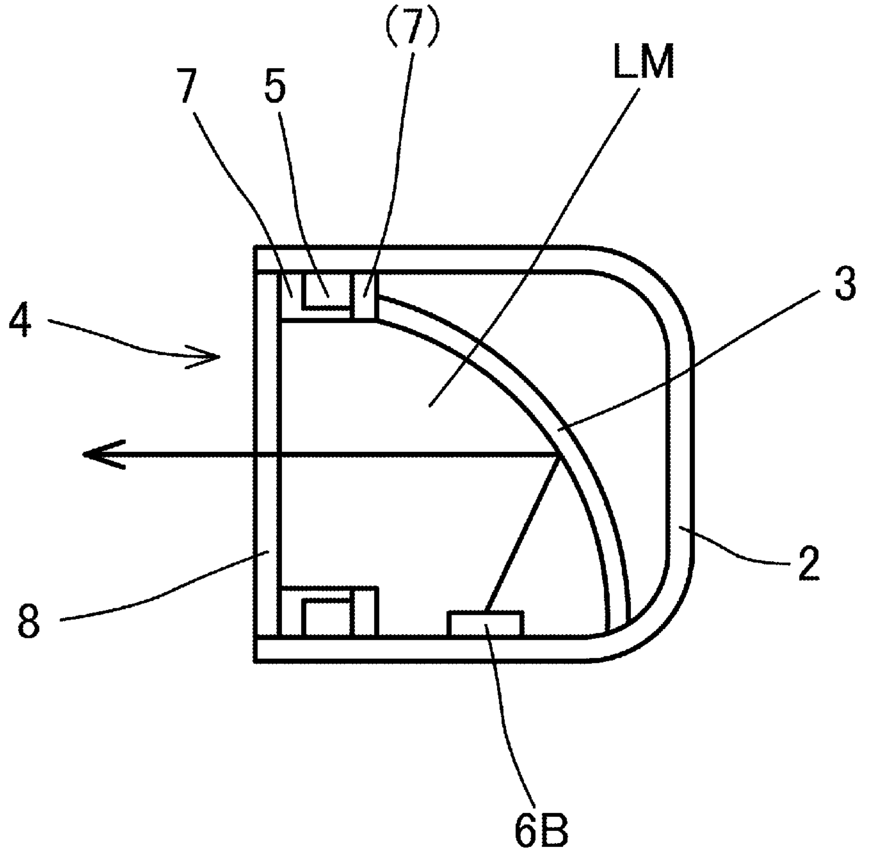
FIG. 11 is a cross-sectional structural view depicting another exemplary embodiment of a headlight including a vehicle decorative lighting device made in accordance with principles of the disclosed subject matter.
Figure 12A:
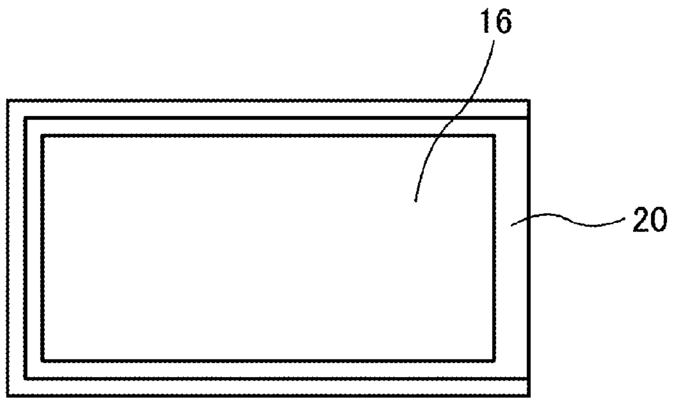
FIG. 12a Conventional Art
FIG. 12*a* is a schematic top view showing a conventional headlight including an illumination device which is formed in a rectangular shape.
Figure 12B:
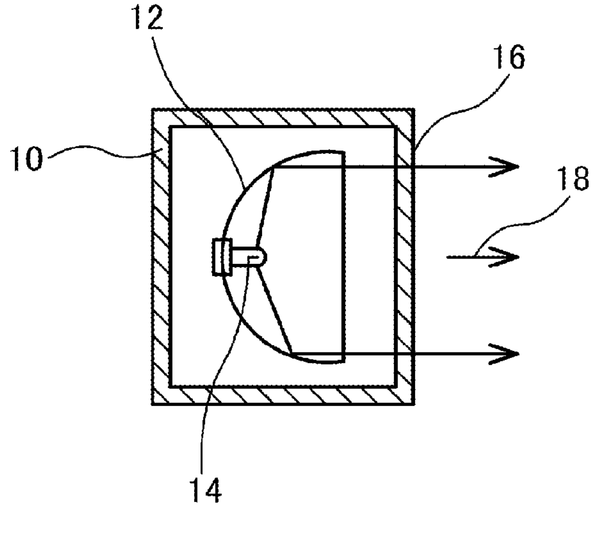
FIG. 12b Conventional Art
FIG. 12*b* is a schematic cross-sectional side view showing the conventional headlight of FIG. 12*a* in which the illumination device is not shown.
Figure 13:
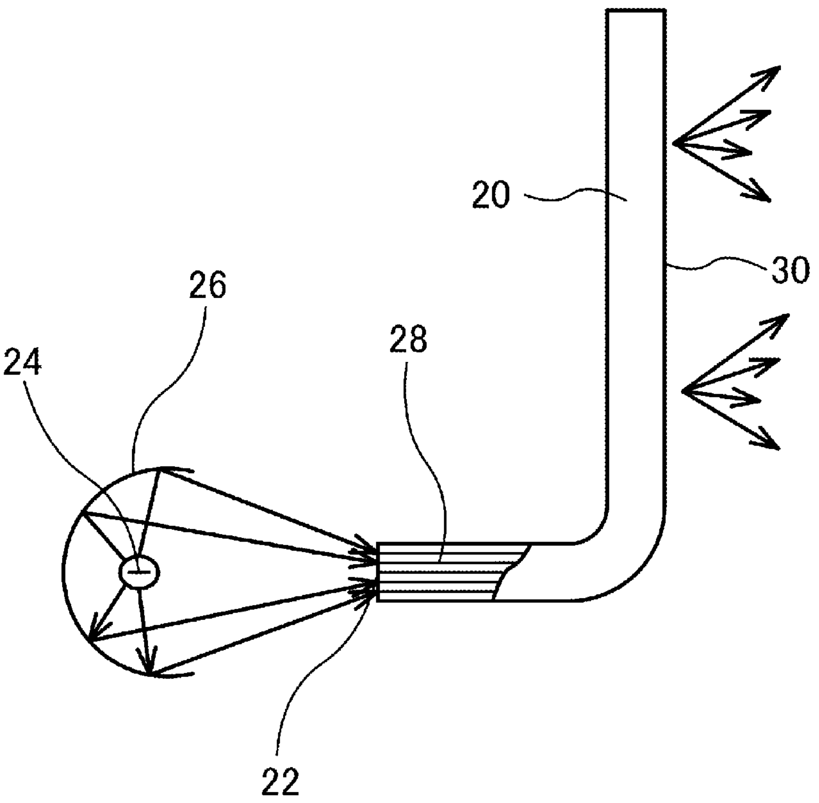
FIG. 13 Conventional Art
FIG. 13 is a schematic view depicting a light guide element, which is used for the conventional headlight shown in FIG. 12*a*.

Exemplary embodiments of a case where the vehicle lamp 1 is used as a headlight will now be described with reference to FIGS. 10 and 11. FIG. 10 is a cross-sectional structural view depicting an exemplary embodiment of a projector type headlight including the decorative lighting device made in accordance with principles of the disclosed subject matter. A basic structure of the projector type headlight using an LED light source is disclosed in Patent Document No. 4 (refer to FIG. 10 in Patent Document No. 4), and FIG. 10 shows an exemplary embodiment of the projector type headlight 4 including the above-described decorative lighting device.

The headlight 4 can include: the housing 2 having the opening, and the opening including an edge portion; the outer lens 8 having an edge portion located adjacent the front surface of the light guide lens 5, and the edge portion of the outer lens 8 located adjacent the edge portion of the opening of the housing 2; a panel 7 located between the outer lens 8 and the pair of LED light sources 6 (not shown in FIG. 10 because they are located at the end surfaces 51*a* and 52*a* of the light guide lens 5) so that light emitted from the light sources 6 does not direct toward the outer lens 8, extending toward the rear surface of the light guide lens 5 and being located adjacent the rear surface of the light guide lens 5 so that light leaked from the light guide lens 5 is reflect into the light guide 5.

In addition, the headlight 4 can also include: a lamp room LM between the housing and 2 the outer lens 8, and the lamp room LM including the vehicle decorative lighting device so that the front surface of the light guide lens 5 faces the outer lens 8; a projector lens 9 having an optical axis OX and a light-emitting surface located in the lamp room LM along with the vehicle decorative lighting device so that the light-emitting surface of the projector lens 9 faces the outer lens 8; and a light source 6A having an optical axis located adjacent the housing 2 in the lamp room LM so that the optical axis of the light source 6A corresponds to the substantially optical axis OX of the projector lens 9, wherein the light source 6A is at least one of an HID bulb and a white LED light source.

Patent Document No. 4 (refer to FIG. 9 in Patent Document No. 4) also discloses a reflector type headlight using an LED light source. FIG. 11 is a cross-sectional structural view depicting another exemplary embodiment of the headlight including the vehicle decorative lighting device, wherein the headlight is disclosed in Patent Document No. 4 without the vehicle decorative lighting device.

The reflector type headlight 4 can include: a housing 2 having an opening, and the opening including an edge portion; an outer lens 8 having an edge portion located adjacent the front surface of the light guide lens 5 of the vehicle decorative lighting device, and the edge portion of the outer lens 8 located adjacent the edge portion of the opening of the housing 2; a panel 7 located between the outer lens 8 and the pair of LED light sources 6 of the vehicle decorative lighting device, extending toward the rear surface of the light guide lens 5 and being located adjacent the rear surface of the light guide lens 5 in common with the above-described projector type headlight 4.

Additionally, the reflector type headlight 4 can include: a lamp room LM between the housing 2 and the outer lens 8, and the lamp room LM including the vehicle decorative lighting device so that the front surface of the light guide lens 5 faces the outer lens 8; at least one reflector 3 having a light-reflecting surface located in the lamp room LM along with the vehicle decorative lighting device; and a light source 6B located in the lamp room so that at least a part of light emitted from the light source 6B is reflected by the at least one reflector 3 and is emitted from the outer lens 8, wherein the light source 6B is at least one of an HID bulb and a white LED light source.

In these cases, the headlights 4 may emit a bluish white light because the at least one of an HID bulb and a white LED light source is used as a light source for the headlight 4, and the vehicle decorative light device may also emit a bluish white light using a white LED light source as the light sources 6. Accordingly, because the vehicle decorative lighting device can emit a harmonious favorable white light with light emitted from the headlight 4 so as to be able to use as a position lamp, the headlight 4 including the vehicle decorative lighting device can provide a favorable light distribution having a high visibility and a high visual quality with a simple structure.

The above-described embodiments relate to the headlights using an LED light source including the vehicle decorative lighting device, which can be incorporated in the lamp room LM. The vehicle lamp 1 can incorporate at least one of various vehicle lamps such as a low beam headlight, a high beam headlight, a turn signal lamp and the like using various light sources such as an HID bulb, a white LED light source, a halogen bulb, etc. as disclosed in Patent Document No. 5, along with the vehicle decorative lighting device. In addition, the vehicle lamp 1 can also incorporate at least one of vehicle signal lamps such as a tail lamp, a stop lamp and the like, as disclosed in Patent Document No. 6, along with the vehicle decorative lighting device.

For example, when the vehicle lamp 1 includes a stop lamp such that a red LED light source is used as a light source, the vehicle decorative lighting device can emit a harmonious red light with light emitted from the stop lamp so as to be able to use as a tail lamp by using a red LED light source as the light sources 6. Therefore, the vehicle lamp 1 including the stop lamp and the vehicle decorative lighting device can provide a harmonious favorable light distribution having a high visibility and a high visual quality with a simple structure In these cases, the panel 7 can be made of a metallic material having a high reflectivity, and also can be made from a plastic material having a high reflectivity on which a metallic layer such as aluminum and the like is coated thereon by a vapor deposition method, etc. The vehicle decorative lighting device can return light leaked from the light guide lens 5 into the light guide lens 5 again by reflecting the leaked light using the panel 7 having a high reflectivity, which is located adjacent the rear surface of the light guide lens 5, and therefore can improve a light-emitting efficiency of the lighting device.

The housing 2 can be made by casting a resin having a reflectivity such as a white poly arylate, polyethylene terephthalate, etc. The vehicle decorative lighting device can also return light leaked from the outer surface of the light guide lens 5 into the light guide lens 5 again by reflecting the leaked light on the housing 2, which is located adjacent the outer surface of the light guide lens 5 at an edge portion of the opening, and can also provide light having a high light-emitting efficiency from the outer lens 8, which is made of a transparent resin.

According to the exemplary vehicle lamps, the exemplary vehicle lamps can incorporate various vehicle lamps such as a headlight and the like along with the vehicle decorative lighting device, which can be incorporated into a narrow space along a periphery of the opening of the housing in the lamp room, and which can various color lights using the LED light sources. Thus, the disclosed subject matter can also provide vehicle lamps including the vehicle decorative lighting devices, which can easily incorporate various vehicle lamps such as a low beam headlight, a high beam headlight and the like along with the decorative lighting device, and which can also emit a harmonious light with light emitted from the vehicle decorative lighting device.

Various modifications of the above disclosed embodiments can be made without departing from the spirit and scope of the presently disclosed subject matter. For example, cases where the light guide lens of the vehicle decorative lighting device is formed in a substantially slender U-shape are described. However, the light guide lens is not limited to this shape and can be formed in various shapes such as a C-shape formed in a nearly ring shape, a rectangular ring shape which can be formed by locating an additional linear light guide lens between the first and second end surfaces or by locating two light guide lens so that each of two first and second end surfaces thereof faces with respect to each other or to another surface of it, a pentagonal ring shape which can be formed locating two light guide lens so that each of two first and second end surfaces thereof face with respect to each other or to another one of it, etc. In addition, the specific arrangement between components can vary between different applications, and several of the above-described features can be used interchangeably between various embodiments depending on a particular application of the device.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A vehicle decorative lighting device, comprising:

a light guide lens having a front surface, a rear surface, an inner surface, an outer surface, a reference plane, a first end surface, a second end surface and a longitudinal axis, and including a first linear portion, a second linear portion, a third linear portion, a first curved portion having a first curvature radius curving along the longitudinal axis of the light guide lens and a second curved portion having a second curvature radius curving along the longitudinal axis of the light guide lens, the first linear portion including the first end surface, linearly extending along the longitudinal axis of the light guide lens and continuously connecting to the first curved portion at a location opposite the first end surface and along the longitudinal axis of the light guide lens, the second linear portion including the second end surface, linearly extending along the longitudinal axis of the light guide lens and continuously connecting to the second curved portion at a location opposite the second end surface and along the longitudinal axis of the light guide lens, the third linear portion also extending along the longitudinal axis of the light guide lens in a substantially linear fashion and continuously connecting between the first curved portion and the second curved portion so that the inner surface of the first linear portion faces the inner surface of the second linear portion, and therefore the inner surface of the light guide lens smoothly connecting in order of a substantially planar surface of the first linear portion, a substantially curved surface of the first curved portion, a substantially planar surface of the third linear surface, a substantially curved surface of the second curved portion and a substantially planar surface of the second linear portion from the first end surface to the second end surface, and also the outer surface of the light guide lens smoothly connecting in order of a substantially planar surface of the first linear portion, a substantially curved surface of the first curved portion, a substantially planar surface of the third linear surface, a substantially curved surface of the second curved portion and a substantially planar surface of the second linear portion from the first end surface to the second end surface, the reference plane formed in a continuous planar shape between the first end surface and the second end surface and being located in parallel with the rear surface, the front surface including at least one of the reference plane and a convex surface formed on the reference plane, the rear surface including a plurality of prism faces, the plurality of prism faces of the rear surface being arranged at an interval along the longitudinal axis of the light guide lens and each of the prism faces extending in a direction substantially perpendicular to the longitudinal axis of the light guide lens while forming a substantially triangular shape in the direction substantially perpendicular to the longitudinal axis of the light guide lens; and a pair of light-emitting diode (LED) light sources each having a light-emitting surface and an optical axis, each of the light-emitting surfaces of the pair of LED light sources facing a respective one of the first end surface and the second end surface, and each of the optical axes of the pair of LED light sources extending along a respective one of the longitudinal axis of the first linear portion and the longitudinal axis of the second linear portion.

2. The vehicle decorative lighting device according to claim 1, wherein a length along the longitudinal axis of the first linear portion is longer than a length along the longitudinal axis of the second linear portion, and the first curvature radius of the first curved portion is smaller than the second curvature radius of the second curved portion.

3. The vehicle decorative lighting device according to claim 1, wherein the interval of the plurality of prism faces arranged along the longitudinal axis of the light guide lens on the rear surface of the light guide lens is 0.3 millimeters or less.

4. The vehicle decorative lighting device according to claim 2, wherein the interval of the plurality of prism faces arranged along the longitudinal axis of the light guide lens on the rear surface of the light guide lens is 0.3 millimeters or less.

5. The vehicle decorative lighting device according to claim 1, further comprising:

a reflective sheet being located adjacent at least a part of at least one of the rear surface, the outer surface and the inner surface of the light guide lens.

6. The vehicle decorative lighting device according to claim 2, further comprising:

a reflective sheet being located adjacent at least a part of at least one of the rear surface, the outer surface and the inner surface of the light guide lens.

7. A vehicle decorative lighting device, comprising:

a light guide lens having a front surface, a rear surface, an inner surface, an outer surface, a first end surface, a second end surface, a reference plane and a longitudinal axis, and including a first linear portion, a second linear portion, a third linear portion including the reference plane, a first curved portion having a first curvature radius curving along the longitudinal axis of the light guide lens and a second curved portion having a second curvature radius curving along the longitudinal axis of the light guide lens, the first linear portion including the first end surface, linearly extending along the longitudinal axis of the light guide lens and continuously connecting to the first curved portion at a location opposite the first end surface of the light guide lens, the second linear portion including the second end surface, linearly extending along the longitudinal axis of the light guide lens and continuously connecting to the second curved portion at a location opposite the second end surface of the light guide lens, the third linear portion also extending along the longitudinal axis of the light guide lens in a substantially linear fashion and continuously connecting between the first curved portion and the second curved portion of the light guide lens so that the inner surface of the first linear portion faces the inner surface of the second linear portion, and therefore the inner surface of the light guide lens smoothly connecting in order of a substantially planar surface of the first linear portion, a substantially curved surface of the first curved portion, a substantially planar surface of the third linear surface, a substantially curved surface of the second curved portion and a substantially planar surface of the second linear portion from the first end surface to the second end surface, and also the outer surface of the light guide lens smoothly connecting in order of a substantially planar surface of the first linear portion, a substantially curved surface of the first curved portion, a substantially planar surface of the third linear surface, a substantially curved surface of the second curved portion and a substantially planar surface of the second linear portion from the first end surface to the second end surface, the reference plane formed in a continuous planar shape between the first end surface and the second end surface and being located in parallel with the rear surface, the front surface including at least one of the reference plane and a convex surface formed on the reference plane, the rear surface including a plurality of prism faces, the plurality of prism faces of the rear surface being arranged at an interval along the longitudinal axis of the light guide lens and each of the prism faces extending in a direction substantially perpendicular to the longitudinal axis of the light guide lens while forming a substantially triangular shape in the direction substantially perpendicular to the longitudinal axis of the light guide lens, and wherein the reference surface intersects with at least a part of the inner surface of the third linear portion at an acute angle and intersects with at least a part of the outer surface of the third linear portion at an obtuse angle, and at least a part of the front surface of the third linear portion is formed in a convex shape on the reference plane between the part of the inner surface of the third linear portion and the part of the outer surface of the third linear portion; and a pair of light-emitting diode (LED) light sources each having a light-emitting surface and an optical axis, each of the light-emitting surfaces of the pair of LED light sources facing a respective one of the first end surface and the second end surface, and each of the optical axes of the pair of LED light sources extending along a respective one of the longitudinal axis of the first linear portion and the longitudinal axis of the second linear portion.

8. The vehicle decorative lighting device according to claim 7, wherein a length along the longitudinal axis of the first linear portion is longer than a length along the longitudinal axis of the second linear portion, and the first curvature radius of the first curved portion is smaller than the second curvature radius of the second curved portion.

9. The vehicle decorative lighting device according to claim 7, wherein the interval of the plurality of prism faces arranged along the longitudinal axis of the light guide lens on the rear surface of the light guide lens is 0.3 millimeters or less.

10. The vehicle decorative lighting device according to claim 8, wherein the interval of the plurality of prism faces arranged along the longitudinal axis of the light guide lens on the rear surface of the light guide lens is 0.3 millimeters or less.

11. The vehicle decorative lighting device according to claim 7, further comprising:

a reflective sheet being located adjacent at least a part of at least one of the rear surface, the outer surface and the inner surface of the light guide lens.

12. The vehicle decorative lighting device according to claim 8, further comprising:

a reflective sheet being located adjacent at least a part of at least one of the rear surface, the outer surface and the inner surface of the light guide lens.

13. A vehicle lamp including the vehicle decorative lighting device according to claim 1, comprising:

a housing having an opening, and the opening including an edge portion;

an outer lens having an edge portion located adjacent the front surface of the light guide lens of the vehicle decorative lighting device, and the edge portion of the outer lens located adjacent the edge portion of the opening of the housing;

a panel having a reflectivity located between the outer lens and the pair of LED light sources of the vehicle decorative lighting device;

a lamp room between the housing and the outer lens, and the lamp room including the vehicle decorative lighting device so that the front surface of the light guide lens of the vehicle decorative device faces the outer lens; and at least one of a low beam headlight having a low beam light source and a light-emitting direction, a high beam headlight having a high beam light source and a light-emitting direction, a stop lamp having a light-emitting direction and a turn signal lamp having a light-emitting direction located in the lamp room along with the vehicle decorative lighting device, wherein each of the light-emitting directions of the low beam headlight, the high beam headlight, the stop lamp and the turn signal lamp is directed toward the outer lens.

14. A vehicle lamp including the vehicle decorative lighting device according to claim 7, comprising:

a housing having an opening, and the opening including an edge portion;

an outer lens having an edge portion located adjacent the front surface of the light guide lens of the vehicle decorative lighting device, and the edge portion of the outer lens located adjacent the edge portion of the opening of the housing;

a panel having a reflectivity located between the outer lens and the pair of LED light sources of the vehicle decorative lighting device;

a lamp room between the housing and the outer lens, and the lamp room including the vehicle decorative lighting device so that the front surface of the vehicle decorative device faces the outer lens; and at least one of a low beam headlight having a low beam light source and a light-emitting direction, a high beam headlight having a high beam light source and a light-emitting direction, a stop lamp having a light-emitting direction and a turn signal lamp having a light-emitting direction located in the lamp room along with the vehicle decorative lighting device, wherein each of the light-emitting directions of the low beam headlight, the high beam headlight, the stop lamp and the turn signal lamp is directed toward the outer lens.

15. The vehicle lamp according to claim 13, wherein the panel extends toward the rear surface of the light guide lens of the vehicle decorative light device so as to be located adjacent the rear surface of the light guide lens.

16. The vehicle lamp according to claim 14, wherein the panel extends toward the rear surface of the light guide lens of the vehicle decorative light device so as to be located adjacent the rear surface of the light guide lens.

17. The vehicle lamp according to claim 13, wherein each of the low beam light source of the low beam headlight and the high beam light source of the high beam headlight is at least one of an HID bulb and a white LED light source.

18. The vehicle lamp according to 14, wherein each of the low beam light source of the low beam headlight and the high beam light source of the high beam headlight is at least one of an HID bulb and a white LED light source.

19. A vehicle lamp including the decorative lighting device according to claim 7, comprising:

a housing having an opening, and the opening including an edge portion;

an outer lens having an edge portion located adjacent the front surface of the light guide lens of the vehicle decorative lighting device, and the edge portion of the outer lens located adjacent the edge portion of the opening of the housing;

a panel having a reflectivity located between the outer lens and the pair of LED light sources of the vehicle decorative lighting device, extending toward the rear surface of the light guide lens of the vehicle decorative lighting device and being located adjacent the rear surface of the light guide lens;

a lamp room between the housing and the outer lens, and the lamp room including the vehicle decorative lighting device so that the front surface of the light guide lens of the vehicle decorative device faces the outer lens;

a projector lens having an optical axis and a light-emitting surface located in the lamp room along with the vehicle decorative lighting device so that the light-emitting surface of the projector lens faces the outer lens; and a light source having an optical axis located adjacent the housing in the lamp room so that the optical axis of the light source substantially corresponds to the optical axis of the projector lens, wherein the light source is at least one of an HID bulb and a white LED light source.

20. A vehicle lamp including the decorative lighting device according to claim 1, comprising:

a housing having an opening, and the opening including an edge portion;

an outer lens having an edge portion located adjacent the front surface of the light guide lens of the vehicle decorative lighting device, and the edge portion of the outer lens located adjacent the edge portion of the opening of the housing;

a panel having a reflectivity located between the outer lens and the pair of LED light sources of the vehicle decorative lighting device, extending toward the rear surface of the light guide lens of the vehicle decorative lighting device and being located adjacent the rear surface of the light guide lens;

a lamp room between the housing and the outer lens, and the lamp room including the vehicle decorative lighting device so that the front surface of the light guide lens of the vehicle decorative device faces the outer lens;

at least one reflector located in the lamp room along with the vehicle decorative lighting device; and a light source located in the lamp room so that at least a part of light emitted from the light source is reflected by the at least one reflector and is emitted from the outer lens, wherein the light source is at least one of an HID bulb and a white LED light source.

* * * * *